United States Patent
Liu et al.

(10) Patent No.: US 11,415,858 B2
(45) Date of Patent: Aug. 16, 2022

(54) PHOTOELECTRIC DISPLAY UNIT AND DISPLAY DEVICE INCLUDING THEREOF

(71) Applicant: GIANTPLUS TECHNOLOGY CO., LTD, Miaoli County (TW)

(72) Inventors: Kang-Chih Liu, Taoyuan (TW); Chen-Hsi Kang, Taoyuan (TW); Kai-Ju Chou, Taoyuan (TW)

(73) Assignee: GIANTPLUS TECHNOLOGY CO., LTD, Miaoli County (TW)

( * ) Notice: Subject to any disclaimer, the term of this patent is extended or adjusted under 35 U.S.C. 154(b) by 298 days.

(21) Appl. No.: 16/901,007

(22) Filed: Jun. 15, 2020

(65) Prior Publication Data
US 2021/0373404 A1 Dec. 2, 2021

(30) Foreign Application Priority Data
Jun. 1, 2020 (TW) .................................. 109118242

(51) Int. Cl.
*G02F 1/167* (2019.01)
*G02F 1/1345* (2006.01)
*H01L 27/12* (2006.01)
*G02F 1/133* (2006.01)

(52) U.S. Cl.
CPC .......... *G02F 1/167* (2013.01); *G02F 1/13454* (2013.01); *G02F 1/13324* (2021.01); *H01L 27/12* (2013.01)

(58) Field of Classification Search
CPC ...................................................... G02F 1/167
See application file for complete search history.

(56) References Cited

U.S. PATENT DOCUMENTS

| 2009/0174928 A1 | 7/2009 | Kim et al. |
| 2020/0313040 A1* | 10/2020 | Nishioka ................. H01L 33/08 |

FOREIGN PATENT DOCUMENTS

| CN | 108010969 | 5/2018 | |
| TW | 201036151 | 10/2010 | |
| TW | I377392 | 11/2012 | |
| TW | 201508931 | 3/2015 | |
| WO | 2009149721 | 12/2009 | |
| WO | WO-2011077870 A1 * | 6/2011 | ......... G02F 1/13306 |

OTHER PUBLICATIONS

"Office Action of Taiwan Counterpart Application", dated May 20, 2021, p. 1-p. 7.

* cited by examiner

*Primary Examiner* — Edmond C Lau
(74) *Attorney, Agent, or Firm* — JCIPRNET

(57) ABSTRACT

A photoelectric display unit including a bottom electrode layer, a photoelectric conversion layer and a top electrode layer is provided. The photoelectric conversion layer is disposed between the bottom electrode layer and the top electrode layer, and includes a first extrinsic semiconductor layer, an intrinsic semiconductor layer and a second extrinsic semiconductor layer. The intrinsic semiconductor layer is disposed between the first extrinsic semiconductor layer and the second extrinsic semiconductor layer. The intrinsic semiconductor layer includes a semiconductor material with a range of a band gap of 1.7 ev~3.2 ev.

9 Claims, 2 Drawing Sheets

PHOTOELECTRIC DISPLAY UNIT AND DISPLAY DEVICE INCLUDING THEREOF

CROSS-REFERENCE TO RELATED APPLICATION

This application claims the priority benefit of Taiwan application serial no. 109118242, filed on Jun. 1, 2020. The entirety of the above-mentioned patent application is hereby incorporated by reference herein and made a part of this specification.

BACKGROUND

Technical Field

The disclosure is related to a semiconductor device, and particularly to a photoelectric display unit and a display device including thereof.

Description of Related Art

A conventional display device is generally provided with a color filter layer to separate out the light with different colors. However, the process of the color filter layer, such as a decoration method, a pigment dispersion method, a printing method, a plating method or an ink-jet method, has the disadvantages of the high product costs, the deficiency of light fastness, heat resistance and pattern accuracy, etc.

SUMMARY

An embodiment of the disclosure provides a photoelectric display unit having the use of supplying the power and separating out the light with different colors.

A photoelectric display unit according to an embodiment of the disclosure includes a bottom electrode layer, a photoelectric conversion layer and a top electrode layer. The photoelectric conversion layer is disposed between the bottom electrode layer and the top electrode layer, and includes a first extrinsic semiconductor layer, an intrinsic semiconductor layer and a second extrinsic semiconductor layer. The intrinsic semiconductor layer is disposed between the first extrinsic semiconductor layer and the second extrinsic semiconductor layer. The intrinsic semiconductor layer includes a semiconductor material with a range of a band gap of 1.7 ev~3.2 ev.

In one embodiment of the disclosure, the semiconductor material includes hydrogenated amorphous silicon, gallium phosphide or indium gallium nitride.

In one embodiment of the disclosure, the bottom electrode layer and the top electrode layer include transparent conductive oxides.

An embodiment of the disclosure provides a display device including the photoelectric display unit, which has the use of separating out the light with different colors and fingerprint sensing, in addition to the power supply.

A display device according to an embodiment of the disclosure includes a first substrate, a second substrate, the above photoelectric display unit and an active component layer. The first substrate and the second substrate are opposite to each other. The photoelectric display unit is disposed between the first substrate and the second substrate. The active component layer is disposed between the photoelectric display unit and one of the first substrate and the second substrate. The active component layer is electrically connected to the photoelectric display unit.

In one embodiment of the disclosure, the photoelectric display unit includes a first photoelectric display unit, a second photoelectric display unit and a third photoelectric display unit. The first photoelectric display unit, the second photoelectric display unit and the third photoelectric display unit respectively include a first intrinsic semiconductor layer, a second intrinsic semiconductor layer and a third intrinsic semiconductor layer. The range of the band gap of the semiconductor material respectively included in the first intrinsic semiconductor layer, the second intrinsic semiconductor layer and the third intrinsic semiconductor layer are different between each other.

In one embodiment of the disclosure, the semiconductor material included in the first intrinsic semiconductor layer has the range of the band gap of 1.7 ev~1.95 ev, the semiconductor material included in the second intrinsic semiconductor layer has the range of the band gap of 1.8 ev~2.26 ev, and the semiconductor material included in the third intrinsic semiconductor layer has the range of the band gap of 2.1 ev~3.2 ev.

In one embodiment of the disclosure, further including a light blocking layer, and the light blocking layer is disposed between the neighbor photoelectric display unit.

In one embodiment of the disclosure, the light blocking layer is a stack structure, the stack structure includes the plurality of intrinsic semiconductor layers, and the range of the band gap of the semiconductor material respectively included in the plurality of intrinsic semiconductor layers are different between each other.

In one embodiment of the disclosure, the plurality of intrinsic semiconductor layers include a first intrinsic semiconductor layer, a second intrinsic semiconductor layer and a third intrinsic semiconductor layer stacked in sequence. The semiconductor material included in the first intrinsic semiconductor layer has the range of the band gap of 1.7 ev~1.95 ev, the semiconductor material included in the second intrinsic semiconductor layer has the range of the band gap of 1.8 ev~2.26 ev, and the semiconductor material included in the third intrinsic semiconductor layer has the range of the band gap of 2.1 ev~3.2 ev.

Based on the above, the photoelectric display unit according to the disclosure could separate out the light with different colors, so that the photoelectric display unit could replace the role of the color filter layer while being applied to the display device. For this reason, the display device including the photoelectric display unit according to the disclosure could omit the processing step of the color filter layer, thereby reducing the product costs and the difficulty of the process.

DESCRIPTION OF THE EMBODIMENTS

Figure 1:
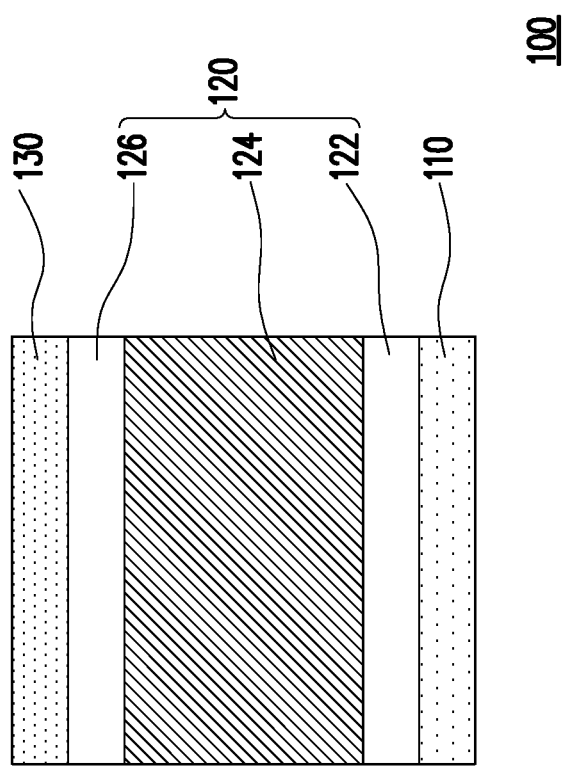
FIG. 1 is a schematic cross-sectional view of the photoelectric display unit according to one embodiment of the disclosure.

FIG. 1 is a schematic cross-sectional view of the photoelectric display unit according to one embodiment of the disclosure.

Referring to FIG. 1, a photoelectric display unit 100 according to the present embodiment includes a bottom electrode layer 110, a photoelectric conversion layer 120 and a top electrode layer 130 laminated in sequence. Namely, the photoelectric conversion layer 120 is disposed between the bottom electrode layer 110 and the top electrode layer 130.

In the present embodiment, the bottom electrode layer 110 is used to collect electron holes generated in the photoelectric conversion layer 120. The forming method of the bottom electrode layer 110 is performed, for example, by using a sputtering deposition method. In some embodiments, a material of the bottom electrode layer 110 is a transparent conductive oxide (TCO). For example, the material of the bottom electrode layer 110 includes indium tin oxide (ITO), aluminum doped zinc oxide (AZO), stannic oxide ($SnO_2$), or indium oxide ($In_2O_3$). A range of a thickness of the bottom electrode layer 110 could affect the transmittance and the electrical resistance of the bottom electrode layer 110. In detail, the thicker the thickness of the bottom electrode layer 110 is, the higher the transmittance of the bottom electrode layer 110 is while the higher the electrical resistance of the bottom electrode layer 110 is, and vice versa.

In the present embodiment, the photoelectric conversion layer 120 could be used to receive the incident light (not shown) and generate the amount of electric charge corresponding to the luminous flux of the incident light. The forming method of the photoelectric conversion layer 120 is performed, for example, by using a chemical vapor deposition method. In some embodiments, the photoelectric conversion layer 120 includes a first extrinsic semiconductor layer 122, an intrinsic semiconductor layer 124 and a second extrinsic semiconductor layer 126 laminated in sequence. Namely, the intrinsic semiconductor layer 124 is disposed between the first extrinsic semiconductor layer 122 and the second extrinsic semiconductor layer 126. In some embodiments, the first extrinsic semiconductor layer 122 includes a first doping type, and the second extrinsic semiconductor layer 126 includes a second doping type. The above first doping type and second doping type respectively are one of P-type and N-type. In the present embodiment, the first doping type is P-type, and the second doping type is N-type, but the disclosure is not limited thereto.

In the present embodiment, the photoelectric conversion layer 120 could be further used to separate out the light with different wavelengths, due to the fact that the intrinsic semiconductor layer 124 of the photoelectric conversion layer 120 includes a semiconductor material which is a direct band gap material with a range of a band gap of 1.7 ev~3.2 ev. When the intrinsic semiconductor layer 124 is irradiated by a light source, whether the light with the specific wavelength could pass through the intrinsic semiconductor layer 124 or not depends on the range of the band gap of the intrinsic semiconductor layer 124. In some embodiments, the intrinsic semiconductor layer 124 could include the semiconductor material with the range of the band gap of 1.7 ev~1.95 ev, for example, the semiconductor material is hydrogenated amorphous silicon. According to Planck's law, the luminescent wavelength of the intrinsic semiconductor layer 124 is about 635 nm~730 nm. Namely, the intrinsic semiconductor layer 124 could spread out red light. In other embodiments, the intrinsic semiconductor layer 124 could include the semiconductor material with the range of the band gap of 1.8 ev~2.26 ev, for example, the semiconductor material is gallium phosphide. According to Planck's law, the luminescent wavelength of the intrinsic semiconductor layer 124 is about 550 nm~688 nm. Namely, the intrinsic semiconductor layer 124 could spread out green light. In another embodiments, the intrinsic semiconductor layer 124 could include the semiconductor material with the range of the band gap of 2.1 ev~3.2 ev, for example, the semiconductor material is indium gallium nitride. According to Planck's law, the luminescent wavelength of the intrinsic semiconductor layer 124 is about 388 nm~590 nm. Namely, the intrinsic semiconductor layer 124 could spread out blue light.

In the present embodiment, the top electrode layer 130 is used to collect electrons generated in the photoelectric conversion layer 120. The forming method of the top electrode layer 130 is also performed, for example, by using a sputtering deposition method. In some embodiments, a material of the top electrode layer 130 is also a transparent conductive oxide. For example, the material of the top electrode layer 130 includes indium tin oxide, aluminum doped zinc oxide, stannic oxide, or indium oxide. A range of a thickness of the top electrode layer 130 could affect the transmittance and the electrical resistance of the top electrode layer 130. In detail, the thicker the thickness of the top electrode layer 130 is, the higher the transmittance of the top electrode layer 130 is while the higher the electrical resistance of the top electrode layer 130 is, and vice versa.

Since the extrinsic semiconductor layer of the photoelectric conversion layer according to the present embodiment includes a semiconductor material with a range of a band gap of 1.7 ev~3.2 ev, the photoelectric conversion layer according to the present embodiment could separate out the light with desired color by modifying the above range of the band gap. Based on the above, the photoelectric conversion layer according to the present embodiment has a plurality of usages. For example, when the photoelectric display unit is applied to a display device, the display device has the use of separating out the light with different colors and fingerprint sensing, in addition to the power supply. Namely, the photoelectric display unit according to the present embodiment could replace the role of the color filter layer of the display device, thereby reducing the product costs and the difficulty of the process of the display device. Furthermore, the display device including the photoelectric display unit according to the present embodiment has the above usages, the customers could determine the desired function depending on the requirements.

Figure 2:
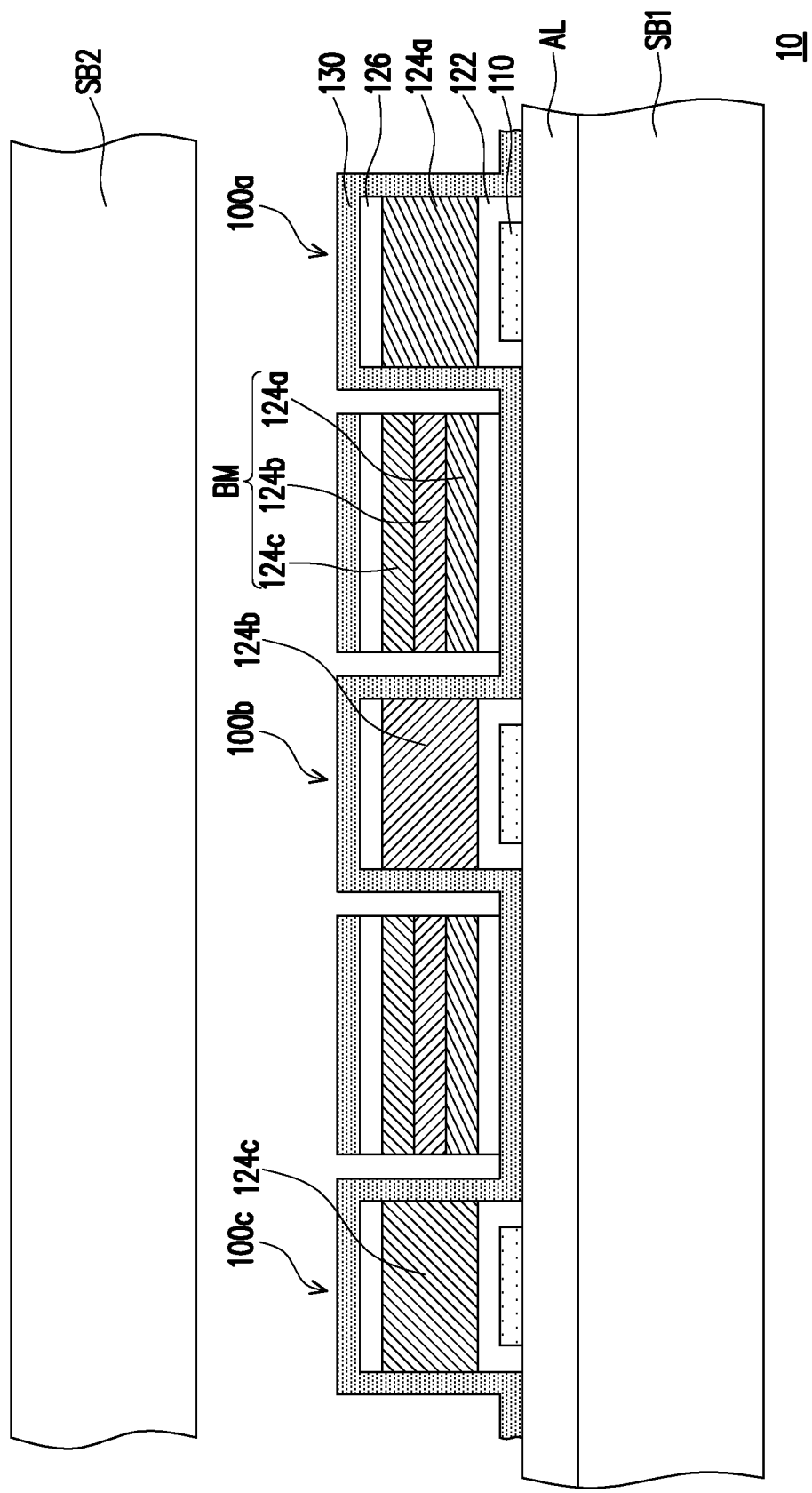
FIG. 2 is a schematic cross-sectional view of the display device according to one embodiment of the disclosure.

FIG. 2 is a schematic cross-sectional view of the display device according to one embodiment of the disclosure. It should be noted here that the embodiment of FIG. 2 adopts the element symbols and partial contents of the embodiment of FIG. 1. The same or similar symbols are used to denote the same or similar elements, and the description of the same technical contents is omitted. For the description of the omitted part, reference is made to the description and effects of the foregoing embodiments, and the descriptions thereof are omitted in the following embodiment. For the description of at least a part of the embodiment of FIG. 2 that is not omitted, reference is made to the contents below.

Referring to FIG. 2, a display device 10 according to the present embodiment includes a first substrate SB1, a second substrate SB2, photoelectric display units 100a~100c, an active component layer AL and a light blocking layer BM.

The first substrate SB1 and the second substrate SB2 are opposite to each other. In some embodiments, the first substrate SB1 and the second substrate SB2 are flexible substrates, such as polymer substrates or plastic substrates, but the disclosure is not limited thereto. In other embodiments, the first substrate SB1 and the second substrate SB2 are rigid substrates, such as glass substrates, quartz substrates or silicon substrates.

The photoelectric display units 100a~100c are disposed between the first substrate SB1 and the second substrate SB2. In the present embodiment, the photoelectric display units 100a~100c are disposed on the first substrate SB1, but the disclosure is not limited thereto. In other embodiments, the photoelectric display units 100a~100c could be disposed on the second substrate SB2. When the photoelectric display units 100a~100c are, for example, irradiated by light emitted from an ambient light or a backlight unit (not shown), the semiconductor material in which could be excited to generate a plurality of electron-hole pairs. After that, the above electron-hole pairs are separated from electrons and electron holes in a p-n junction, and the electrons and the electron holes could respectively be collected by the bottom electrode layer 110 and the top electrode layer 130 of the photoelectric display units 100a~100c and are used to, for example, supply the power to the display device 10. In the present embodiment, the difference between the photoelectric display unit 100a, the photoelectric display unit 100b and the photoelectric display unit 100c is the semiconductor materials respectively included in an intrinsic semiconductor layer 124a, an intrinsic semiconductor layer 124b and an intrinsic semiconductor layer 124c have the range of the band gap which are different between each other. In the present embodiment, the intrinsic semiconductor layer 124a includes the semiconductor material with the range of the band gap of 1.7 ev~1.95 ev, for example, the semiconductor material is hydrogenated amorphous silicon. Therefore, the photoelectric display units 100a could be used to spread out red light. The intrinsic semiconductor layer 124b includes the semiconductor material with the range of the band gap of 1.8 ev~2.26 ev, for example, the semiconductor material is gallium phosphide. Therefore, the photoelectric display units 100b could be used to spread out green light. The intrinsic semiconductor layer 124c includes the semiconductor material with the range of the band gap of 2.1 ev~3.2 ev, for example, the semiconductor material is indium gallium nitride. Therefore, the photoelectric display units 100c could be used to spread out blue light.

The active component layer AL is, for example, disposed between the photoelectric display units 100a~100c and one of the first substrate SB1 and the second substrate SB2. In the present embodiment, the active component layer AL is disposed between the photoelectric display units 100a~100c and the first substrate SB1, but the disclosure is not limited thereto. In other embodiments, the active component layer AL and the photoelectric display units 100a~100c could be disposed on the second substrate SB2 together. The active component layer AL is, for example, any kind of active component layer that is known to persons having ordinary skill in the art, and is used to drive the photoelectric display units 100a~100c. For example, the active component layer AL could include a plurality of scan lines (not shown), a plurality of data lines (not shown), a plurality of transistors (not shown) and a plurality of electrodes (not shown). A drain (not shown) of the transistors could be connected to or be electrically connected to the bottom electrode layer 110 of the photoelectric display units 100a~100c, which would make an electrical connection between the active component layer AL and the photoelectric display units 100a~100c.

A light blocking layer BM is disposed between the neighbor photoelectric display units. For example, the light blocking layer BM could be disposed between the photoelectric display unit 100a and the photoelectric display unit 100b or be disposed between the photoelectric display unit 100b and the photoelectric display unit 100c. The light blocking layer BM could be used to cover the scan lines, the data lines, the transistors and the electrodes in the active component layer AL which is not being desired to be observed by the customers. In detail, the light blocking layer BM overlaps the scan lines, the data lines, the transistors and the electrodes in the above active component layer AL. In the present embodiment, the light blocking layer BM is a stack structure and includes the plurality of intrinsic semiconductor layers. In detail, the stack structure of the light blocking layer BM could be composed of at least two of the intrinsic semiconductor layer 124a, the intrinsic semiconductor layer 124b and the intrinsic semiconductor layer 124c. Based on the above, since the band gap of the intrinsic semiconductor layer 124a, the intrinsic semiconductor layer 124b and the intrinsic semiconductor layer 124c are different between each other, the light blocking layer BM could block the light. For example, the light blocking layer BM could be composed of the intrinsic semiconductor layer 124a and the intrinsic semiconductor layer 124b, and when the light emitted from the ambient light or the backlight unit is irradiated to the intrinsic semiconductor layer 124 of the light blocking layer BM, the intrinsic semiconductor layer 124 could let the red light pass through but absorb the light with other ranges of wavelength. After that, the red light irradiated to the intrinsic semiconductor layer 124b could be absorbed, thereby making the light blocking layer BM have an effect of light-blocking. In the present embodiment, the light blocking layer BM includes the first intrinsic semiconductor layer 124a, the second intrinsic semiconductor layer 124b and the third intrinsic semiconductor layer 124c laminated in sequence, which would have a better effect on light-blocking, but the disclosure is not limited thereto.

Based on the above, since the display device 10 according to the present embodiment includes the photoelectric display units 100a~100c, the display device 10 has the use of separating out the light with different colors, in addition to the power supply. Namely, there is no need to dispose the color filter layer in the display device 10 according to the present embodiment, thereby reducing the product costs and the difficulty of the process of the display device 10 according to the present embodiment.

Furthermore, the display device 10 according to the present embodiment could have the use of fingerprint sensing. In detail, the reverse bias could be applied to the photoelectric display units 100a~100c when programming the fingerprint sensing, and the light emitted from the backlight unit used to irradiate to the finger of the customers could be partially reflected to the photoelectric display units 100a~100c, thereby programming the fingerprint sensing. For example, the light emitted from the backlight unit passes through the photoelectric display unit 100a and emits the red light, and then the red light reaches to the finger of the customers. The wave crest and the wave trough of the fingerprint of the finger are different with each other in terms of the degree of the reflection of the red light; therefore, after the different luminous intensity of the red light respectively reflected by the wave crest and the wave trough is received by the photoelectric display units 100b and 100c, the photoelectric display units 100b and 100c could output the signals to the transistor (the read component) of the active component layer AL to detect the difference, and thereby the fingerprint sensing could be programming.

In summary, the photoelectric display unit provided by the present disclosure has the use of supplying the power, separating out the light with different colors, and so on. The customers could use the photoelectric display unit according to their needs. Furthermore, the display device provided by the present disclosure includes the above photoelectric display unit, which could further have the use of fingerprint sensing.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photoelectric display unit, including:
a bottom electrode layer and a top electrode layer; and
a photoelectric conversion layer, disposed between the bottom electrode layer and the top electrode layer, including:
a first extrinsic semiconductor layer and a second extrinsic semiconductor layer; and
an intrinsic semiconductor layer, disposed between the first extrinsic semiconductor layer and the second extrinsic semiconductor layer,
wherein the intrinsic semiconductor layer includes a semiconductor material with a range of a band gap of 1.7 ev~3.2 ev.

2. The photoelectric display unit according to claim 1, wherein the semiconductor material includes hydrogenated amorphous silicon, gallium phosphide or indium gallium nitride.

3. The photoelectric display unit according to claim 1, wherein the bottom electrode layer and the top electrode layer include transparent conductive oxides.

4. A display device, including:
a first substrate and a second substrate, wherein the first substrate and the second substrate are opposite to each other;
the photoelectric display unit according to claim 1, disposed between the first substrate and the second substrate; and
an active component layer, disposed between the photoelectric display unit and one of the first substrate and the second substrate,
wherein the active component layer is electrically connected to the photoelectric display unit.

5. The display device according to claim 4, wherein the photoelectric display unit includes a first photoelectric display unit, a second photoelectric display unit and a third photoelectric display unit, and the first photoelectric display unit, the second photoelectric display unit and the third photoelectric display unit respectively include a first intrinsic semiconductor layer, a second intrinsic semiconductor layer and a third intrinsic semiconductor layer, wherein the range of the band gap of the semiconductor material respectively included in the first intrinsic semiconductor layer, the second intrinsic semiconductor layer and the third intrinsic semiconductor layer are different between each other.

6. The display device according to claim 5, wherein the semiconductor material included in the first intrinsic semiconductor layer has the range of the band gap of 1.7 ev~1.95 ev, the semiconductor material included in the second intrinsic semiconductor layer has the range of the band gap of 1.8 ev~2.26 ev, and the semiconductor material included in the third intrinsic semiconductor layer has the range of the band gap of 2.1 ev~3.2 ev.

7. The display device according to claim 4, further including a light blocking layer, wherein the light blocking layer is disposed between the neighbor photoelectric display unit.

8. The display device according to claim 7, wherein the light blocking layer is a stack structure, the stack structure includes the plurality of intrinsic semiconductor layers, wherein the range of the band gap of the semiconductor material respectively included in the plurality of intrinsic semiconductor layers are different between each other.

9. The display device according to claim 8, wherein the plurality of intrinsic semiconductor layers include a first intrinsic semiconductor layer, a second intrinsic semiconductor layer and a third intrinsic semiconductor layer stacked in sequence, wherein the semiconductor material included in the first intrinsic semiconductor layer has the range of the band gap of 1.7 ev~1.95 ev, the semiconductor material included in the second intrinsic semiconductor layer has the range of the band gap of 1.8 ev~2.26 ev, and the semiconductor material included in the third intrinsic semiconductor layer has the range of the band gap of 2.1 ev~3.2 ev.

* * * * *